United States Patent
Kwak et al.

(10) Patent No.: US 8,748,864 B2
(45) Date of Patent: Jun. 10, 2014

(54) LIGHT EMITTING DEVICE AND METHOD OF FABRICATING THE SAME

(75) Inventors: Woo Chul Kwak, Ansan-si (KR); Soon Ho An, Ansan-si (KR); Hwa Mok Kim, Ansan-si (KR); Eun Jin Kim, Ansan-si (KR); Jae Hoon Song, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 95 days.

(21) Appl. No.: 13/304,814

(22) Filed: Nov. 28, 2011

(65) Prior Publication Data

US 2012/0132888 A1 May 31, 2012

(30) Foreign Application Priority Data

Nov. 26, 2010 (KR) .................. 10-2010-0118971

(51) Int. Cl.
*H01L 33/04* (2010.01)
*H01L 29/06* (2006.01)

(52) U.S. Cl.
USPC ................................ 257/13; 438/29; 977/932

(58) Field of Classification Search
USPC ............. 257/13, E33.072, E29.005, E33.008; 438/29; 977/932
See application file for complete search history.

(56) References Cited

U.S. PATENT DOCUMENTS

| 2008/0113214 A1* | 5/2008 | Davis et al. .................. 428/690 |
| 2009/0008664 A1* | 1/2009 | Jin et al. ........................ 257/98 |
| 2011/0126891 A1* | 6/2011 | Goto et al. .................... 136/255 |

* cited by examiner

*Primary Examiner* — Whitney T Moore
(74) *Attorney, Agent, or Firm* — H.C. Park & Associates, PLC (57) ABSTRACT

A light emitting device includes a metal backing layer, a reflective electrode layer disposed on the metal backing layer, and a plurality of nanorods disposed on the reflective electrode layer. Each nanorod includes a p-semiconductor layer, an active layer, and an n-semiconductor layer, which are sequentially stacked on the reflective electrode layer. The light emitting device further includes an anti-reflection electrode layer disposed on the nanorods, and quantum dots disposed between the nanorods. The method includes sequentially growing the n-semiconductor layer, the active layer, and the p-semiconductor layer on a substrate; forming the nanorods by etching the p-semiconductor layer using a mask pattern; sequentially forming the reflective electrode layer and the metal backing layer on the p-semiconductor layer and then removing the substrate; disposing quantum dots between the nanorods; and forming the anti-reflection electrode layer on the nanorods.

30 Claims, 4 Drawing Sheets

LIGHT EMITTING DEVICE AND METHOD OF FABRICATING THE SAME

CROSS REFERENCE TO RELATED APPLICATION

This application claims priority from and the benefit of Korean Patent Application No. 10-2010-0118971 filed on Nov. 26, 2010, which is incorporated herein by reference for all purposes as if fully set forth herein.

BACKGROUND OF THE INVENTION

1. Field of the Invention

Exemplary embodiments of the present invention relates to a light emitting device and a method of fabricating the same, and more particularly, to a light emitting device, in which nanorods are disposed such that an active layer is exposed therethrough and quantum dots are distributed between respective nanorods, whereby light emission from the quantum dots may be increased due to energy generated from a Multiple Quantum Well (MQW) structure being is transmitted to the quantum dots, and a method of fabricating the same.

2. Discussion of the Background

A white lighting system typically includes a light emitting device, which emits ultraviolet rays or blue light, and a fluorescent material, which emits light having long wavelengths by absorbing a portion of the light that is emitted from the light emitting device. Here, the light emitting device contains gallium nitride (GaN), particularly aluminum indium gallium nitride ($Al_xIn_yGa_zN$), as its primary ingredient. This white lighting system uses a light source having a single wavelength, and thus has the advantages of a very simple structure and inexpensive cost compared to other types of white lighting systems which use light sources having various wavelengths.

Quantum dots are a minuscule material that was recently developed. Quantum dots generate fluorescent light in a narrow wavelength range, and the light thus generated is stronger than that generated by typical fluorescent materials. Quantum dots are particles in which nanoscale II-IV group semiconductor particles form a core. With quantum dots, light may be emitted when an excited electron drops from the conduction band to the valence band.

Quantum dots are used to increase the light emission efficiency of a light emitting device through Förster Resonance Energy Transfer (FRET), in which energy generated from a Multiple Quantum Well (MQW) of the light emitting device is transferred to the quantum dots. An active layer may also be formed using a coupled quantum dot structure that is double-stacked in the MQW in order to increase light emission efficiency through strong carrier confinement.

However, when the FRET of quantum dots is used, a light emitting device of the related art generally has a film shape, and the distance between the quantum dots and the MQW should be maintained at 10 nm or less. In this case, the quantum dots are a mono-layer applied to is the surface of a film, and thus the density of the quantum dots used for FRET is low. Therefore, it is difficult to increase light emission efficiency.

Furthermore, in order to improve the quality of the portion of the film in which FRET occurs, reverse epitaxial growth is carried out, in which a p-semiconductor layer, such as p-GaN, is grown first, and then an n-semiconductor layer, such as n-GaN, is grown. In this case, the effect that FRET has on increased light emission efficiency is considerably decreased.

Moreover, in the light emitting device of the related art, it is difficult to realize the uniformity of quantum dots on the surface of nanorods, and only some quantum dots participate in emission, depending on the position of the MQW on the nanorods. Therefore, in general, it is difficult to increase the efficiency of the light emitting device.

The information disclosed in this Background of the Invention section is only for better understanding of the background of the invention, and should not be taken as an acknowledgment or any form of suggestion that this information forms a prior art that would already be known to a person skilled in the art.

SUMMARY OF THE INVENTION

Various aspects of the present invention provide a light emitting device and a method of fabricating the same, in which the phenomenon of transferring energy that is generated from a Multiple Quantum Well (MQW) to quantum dots through Förster Resonance Energy Transfer (FRET) can be increased.

An exemplary embodiment of the present invention provides a light emitting device, including a metal layer, a reflective layer disposed on the metal layer, and a plurality of nanorods disposed on the reflective layer in a matrix configuration such that the nanorods are is spaced apart from one another. Each of the nanorods includes a p-semiconductor layer, an active layer, and an n-semiconductor layer, which are sequentially stacked on the reflective layer. The light emitting device further includes an anti-reflection layer disposed on the nanorods, and quantum dots disposed between the nanorods.

An exemplary embodiment of the present invention provides a light emitting device, including a substrate and an n-semiconductor layer disposed on the substrate. The n-semiconductor layer has rods on a portion thereof, the rods being spaced apart from one another in a matrix configuration. The light emitting device further includes a plurality of nanorods disposed on the rods of the n-semiconductor. Each of the nanorods includes an active layer and a p-semiconductor layer, which are sequentially stacked on a corresponding rod of the n-semiconductor. The light emitting device further includes a transparent electrode layer disposed on the nanorods, and quantum dots disposed between the nanorods.

Still another exemplary embodiment of the present invention provides a method of fabricating a light emitting device, including: sequentially growing an n-semiconductor layer, an active layer, and a p-semiconductor layer on a substrate; forming a plurality of nanorods by etching the p-semiconductor layer, such that part of the substrate is exposed, using a mask pattern, the mask pattern having pattern elements spaced apart from one another in a matrix configuration; sequentially forming a reflective layer and a metal layer on the p-semiconductor layer and then removing the substrate; disposing quantum dots between the nanorods; and forming an anti-reflection layer on the nanorods.

Still another exemplary embodiment of the present invention provides a method of fabricating a light emitting device, including: sequentially growing an n-semiconductor layer, an active layer, and a p-semiconductor layer on a substrate; forming a plurality of nanorods by is etching the p-semiconductor layer using a mask pattern such that the active layer is exposed, the mask pattern having pattern elements spaced apart from one another in a matrix configuration; disposing quantum dots between the nanorods; and forming a transparent electrode layer on the nanorods.

According to embodiments of the invention, it is possible to increase the light emission efficiency of the light emitting device by enhancing the phenomenon by which energy that is generated from an MQW is transferred to the quantum dots through FRET.

In addition, since the quantum dots are disposed in a three dimensional configuration such that they are close to the MQW of the active layer, the density of quantum dots that participate in FRET is increased. This, consequently, may increase the light emission efficiency of the light emitting device and reduce heat generated as a result of the direct emission of light from the MQW of the active layer.

Furthermore, since the emission wavelength may be easily adjusted based on the size and type of quantum dots, it is possible to generate visible light, including white light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., may be exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In contrast, It will be understood that is when an element such as a layer, film, region, or substrate is referred to as being "beneath" another element, it can be directly beneath the other element or intervening elements may also be present. Meanwhile, when an element is referred to as being "directly beneath" another element, there are no intervening elements present.

First, with reference to FIG. 1, a light emitting device 10 according to an exemplary embodiment of the invention will be described.

Figure 1:
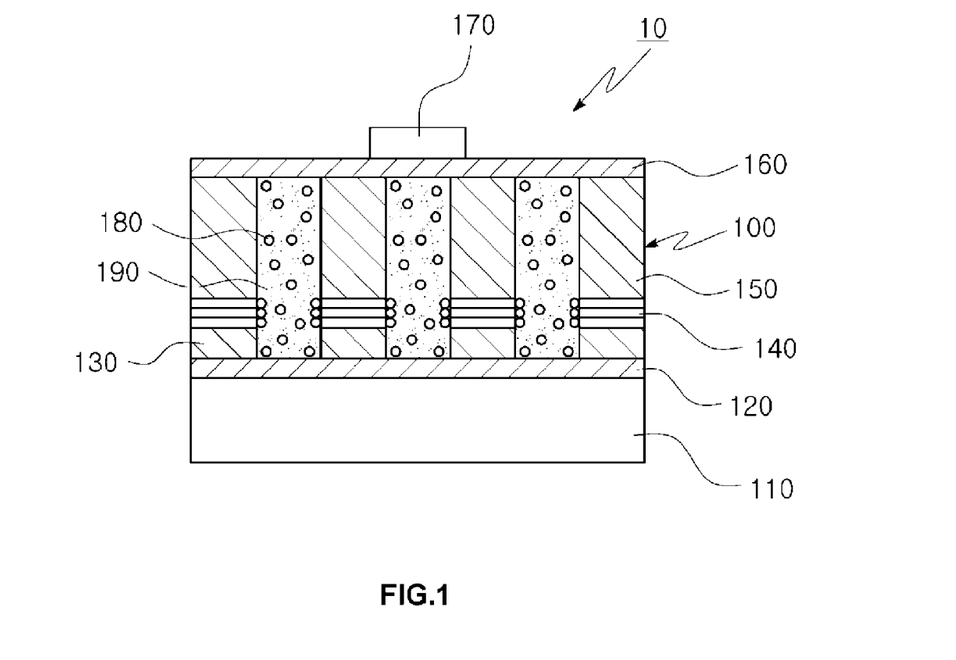
FIG. 1 is a cross-sectional view that illustrates a light emitting device according to an exemplary embodiment of the invention.
Figure 2:
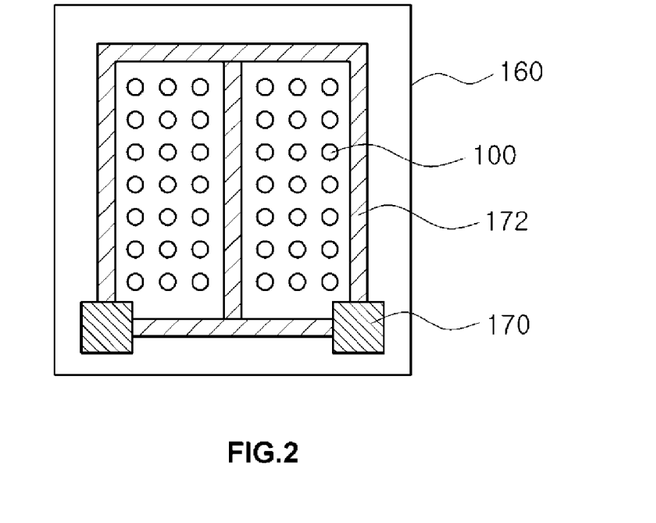
FIG. 2 is a top plan view of the light emitting device illustrated in FIG. 1.

FIG. 1 is a cross-sectional view that illustrates the light emitting device 10 according to an exemplary embodiment of the invention, and FIG. 2 is a top plan view of the light emitting device 10 illustrated in FIG. 1.

The light emitting device 10 may be a vertical light emitting device, which includes a metal backing layer 110, a reflective electrode layer 120 disposed on the metal backing layer 110, and a plurality of nanorods 100 disposed on the reflective electrode layer 120. Each of the nanorods 100 may include a p-semiconductor layer 130, an active layer 140, and an n-semiconductor layer 150, which are sequentially stacked on the reflective electrode layer 120. The light emitting device 10 may also include an anti-reflection electrode layer 160 disposed on the nanorods 100, an n-electrode pad 170 disposed on the anti-reflection electrode layer 160, and quantum dots 180 and a filler 190 filling the space between the nanorods 100.

The metal backing layer 110 is a metallic material disposed on a semiconductor substrate. The semiconductor substrate may be a conductive ceramic substrate made of a material such as, but not limited to, Nb-doped $SrTiO_3$, Al-doped ZnO (AlZnO), Indium Tin Oxide (ITO), and Indium Zinc Oxide (IZO), or an impurity-doped semiconductor substrate made of a material such as, but not limited to, B-doped Si, As-doped Si, and impurity-doped diamond. The metallic material may be made of at least one material such as Au, Ni, W, Mo, Cu, Al, Ta, Ag, Pt, and Cr, for example, Cu/W or Cu/Mo.

The reflective electrode layer 120 may be a layer that has excellent reflective characteristics to reduce light passing through toward the metal backing layer 110. The reflective electrode layer 120 may be made of at least one material such as Ni, Al, Pt, Ru, Ir, Rh, Ta, Mo, Ti, Ag, W, Cu, Cr, Pd, V, Co, Nb, and Zr, for example, Ni/Ag, Pt/Ag, Ru/Ag, or Ir/Ag.

The nanorods 100 may be disposed in a matrix configuration on the reflective electrode layer 120 such that they are spaced apart from one another. The nanorods may have lengths ranging from 500 nm to 4 µm, a diameter of 1 µm or less, and an interval therebetween of 1 µm or less. In each of the nanorods 100, the p-semiconductor layer 130, the active layer 140, and the n-semiconductor layer 150 may be sequentially stacked from the bottom, and the active layer 140 is exposed.

Although the nanorods 100 have been described as being disposed across the n-semiconductor layer 150 in this embodiment, other arrangements are possible because the nanorods may be disposed in various shapes as long as the active layer 140 is exposed. For example, the nanorods 100 may be disposed in a part of the lower portion of the n-semiconductor layers 150, and the rest of the lower portion may be formed such that they are integrated with other portions of the n-semiconductor layers 150.

The p-semiconductor layer 130 may be made of p-type $Al_xIn_yGa_{1-x-y}N$, where 0≤x, y, and x+y=1, which is a semiconductor material doped with a p-dopant. Examples of the nitride semiconductor material may include, but not limited to, GaN, AlGaN, and InGaN, and examples of the p-dopant used in the doping may include, but not limited to, Mg, Zn, and Be. Mg may be used as the p-dopant.

The active layer 140 is an area that emits light through electron-hole recombination, and may have a Multiple Quantum Well (MQW) structure, in which two or more layers of quantum well and quantum barrier are stacked on one another, or a single quantum well structure. The barrier and well layers may be made of a material such as binary to quaternary compounds denoted by the general formula: $Al_xIn_yGa_{1-x-y}N$, where $0 \leq x, y$, and $x+y=1$. For example, the MQW structure may be formed by growing the InGaN layer as a well layer and the GaN layer as a barrier layer. In particular, an MQW structure made of, for example, InGaN/GaN may be used for blue Light Emitting Diodes (LEDs), and an MQW structure, made of, for example, GaN/AlGaN, InAlGaN/InAlGaN, or InGaN/AlGaN may be used for UV emitting devices.

The n-semiconductor layer 150 may be made of n-type $Al_xIn_yGa_{1-x-y}N$, where $0 \leq x, y$, and $x+y=1$, which is a semiconductor material doped with an n-dopant. For example, the nitride semiconductor material may be GaN, AlGaN, InGaN, or the like, and the dopant used in the doping may be Si, Ge, Se, Te, C, or the like, for example, Si.

The anti-reflection electrode layer 160 functions as an electrode together with the n-electrode pad 170, which is disposed thereon, and emits light thus generated to the outside. Thus, the anti-reflection electrode layer 160 may have excellent electrical characteristics and be less likely to obstruct light emission, and may be made of a material such as ITO, ZnO, $SiO_2$, $Si_3N_4$, and IZO.

The n-electrode pad 170 may be made of a material such as Ti/Al, Cr/Au, Cr/Au, and Ni/Au. As illustrated in FIG. 2, a rectangular electrode extension 172 may be disposed in order to prevent or reduce current crowding, which occurs under the n-electrode pad 170, and to induce a uniform current to the multiple nanorods 100.

Although the electrode extension 172 has been described as being rectangular in is this embodiment, this is not intended to be limiting. Rather, various other structures may be used as long as they can alleviate current crowding.

The quantum dots 180 may be disposed between the nanorods 100, such that they emit light using the energy excited from the MQW. The quantum dots 180 may emit strong light due to Förster Resonance Energy Transfer (FRET) if they are sufficiently close to the MQW, for example, at a distance of 10 nm or less. Specifically, if the quantum dots 180 are attached to the surface of the nanorods 100 or are close to the surface of the nanorods 100 at a distance of 10 nm or less, they may emit light due to FRET, thereby increasing light emission efficiency. In addition, since the quantum dots 180 are disposed in a three dimensional configuration with respect to the active layer 140, the quantum dots 180 close to the active layer 140 may have a density that is higher than those in the related art, thereby further increasing the light emission efficiency. On the other hand, the quantum dots 180 that are positioned at a distance greater than 10 nm function as a fluorescent material, which regenerates light through a reaction with light that is emitted from the MQW.

Each of the quantum dots 180 has a certain value of energy band gap that may be sufficiently excited in the light emission wavelengths of the nanorods 100. When this condition is satisfied, light may be generated from various wavelength ranges depending on the energy band gap of the quantum dots 180. Specifically, each of the quantum dots 180 may be made of a material that has an energy band gap corresponding to the light emission wavelength. In this case, the energy band gap may have a size that can be sufficiently excited by the energy that is excited from the MQW. As above, the size and primary material of the quantum dots 180 are determined depending on the light emission wavelengths of the active layer 140. The quantum dots 180 may be made of, for example, a direct band gap material having a band gap of 1.0 eV or more, and more particularly, a material such as, but not limited to, ZnSe (2.54 eV), ZnS (3.3 eV), CdSe (1.74 eV), CdS (2.5 eV), and InP (1.35 eV) depending on the light emission wavelength. In addition, the light emission wavelengths of the quantum dots 180 vary depending on the size of the quantum dots 180, which is the well-known quantum confinement phenomenon. Although the material of the quantum dots 180 has a small energy band gap, it is possible to significantly increase the energy band gap by sufficiently decreasing the size of the quantum dots 180 to the nanometer level. Thus, even if the same material is used for the core, it is possible to emit light in various wavelength ranges. As above, since the energy excited from the MQW may be converted into various wavelengths of light through a reaction with the quantum dots 180, it is possible to generate visible light including white light from inside the light emitting device 10.

In addition, the quantum dots 180 may be attached to the surface of the active layer 140 between the nanorods 100 in order to take advantage of FRET, with a capping ligand or surfactant attached to the surface thereof. The quantum dots 180 may be attached to the surface of the nanorods 100 using the polarity and bonding characteristics of the capping ligand or surfactant. Specifically, the force of bonding to the surface of the nanorods 100 may be enhanced through the conversion of the ligand as described later.

The filler 190 may be disposed between the nanorods 100 for the purpose of filling the space not occupied by the quantum dots 180, which is formed between the nanorods 100, and for the purpose of supporting the anti-reflection electrode layer 160 in the case the formation of the anti-reflection electrode layer 160 is not easy. The filler 190 may be made of a material such as Spin-On Glass (SOG), Polyimide (PI), Polystyrene (PS), and Polycarbonate (PC).

Since the light emitting device 10 has the above-described structure, it is possible is to increase light emission efficiency by increasing the density of the quantum dots that participate in FRET, generate visible light, including white light, due to the ease with which the light emission wavelengths are adjusted, and decrease heat generated as a result of the direct emission of light from the MQW.

Hereinafter, a method of fabricating the light emitting device according to an exemplary embodiment of the invention will be described with reference to FIGS. 3A to 3E.

FIGS. 3A to 3E are cross-sectional views that illustrate the process of fabricating the light emitting device according to an exemplary embodiment of the invention.

The method of fabricating the light emitting device 10 may include the following steps of: sequentially growing an n-semiconductor layer 150, an active layer 140, and a p-semiconductor layer 130 on the upper surface of a substrate 200; forming a plurality of nanorods 100 by etching the p-semiconductor layer 130 using a mask pattern such that parts of the substrate 200 are exposed, the mask pattern having pattern elements spaced apart from one another in a matrix configuration; sequentially forming a reflective electrode layer 120 and a metal backing layer 110 on the p-semiconductor layer 130 and removing the substrate 200; disposing quantum dots 180 between the nanorods 100; and forming an anti-reflection electrode layer 160 on the nanorods 100.

Figure 3:
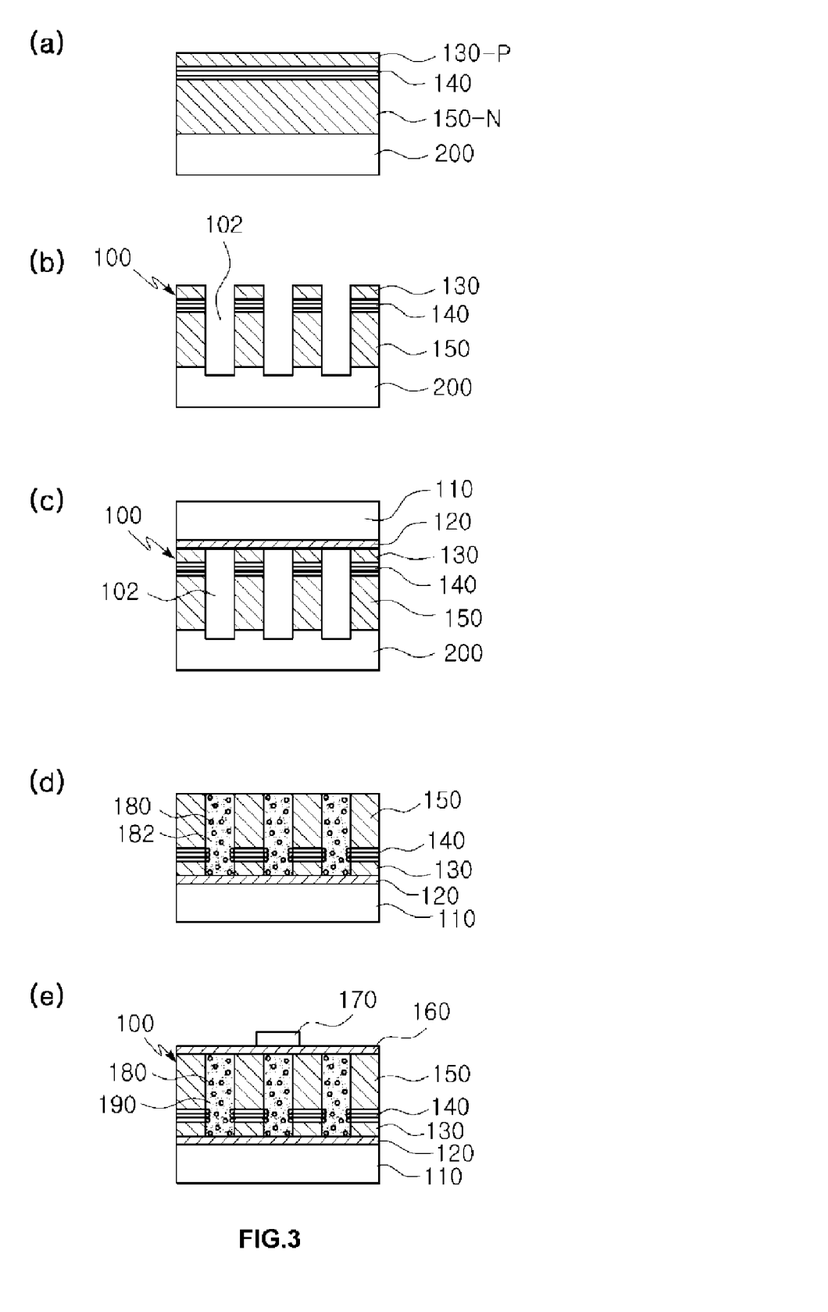
FIGS. 3A to 3E are cross-sectional views that illustrate a process of fabricating the light emitting device according to an exemplary embodiment of the invention.

Describing in more detail, in the first step of this embodiment, as illustrated in FIG. 3A, the n-semiconductor layer 150, the active layer 140, and the p-semiconductor layer 130 are sequentially grown on the substrate 200, specifically by Metal-Organic Chemical Vapor Deposition (MOCVD).

Afterwards, as illustrated in FIG. 3B, the p-semiconductor layer 130 is etched using the mask pattern that has pattern elements spaced apart from one another in a matrix configuration. This mask pattern may be made of $SiO_2$ or Anodic Aluminum Oxide (AAO). Here, as described later, the etching may be performed to the depth at which the MQW of the active layer 140 is completely exposed, for example, to the depth at which portions of the substrate 200 are exposed such that the substrate 200 may be easily removed. Due to this etching, the multiple nanorods 100, which are spaced apart from one another in a matrix configuration, are formed. Each of the nanorods 100 may include the n-semiconductor layer 150, the active layer 140, and the p-semiconductor layer 130. Here, the diameter of each nanorod 100 may be 1 µm or less and the width of individual space 102 defined between the nanorods 100 may be 1 µm or less.

Although the nanorods 100 have been described as being formed across the n-semiconductor layer 150 in this embodiment, this is not intended to be limiting. Alternatively, the nanorods may be formed to have various shapes as long as the active layer 140 is exposed. For example, the nanorods 100 may be formed in a part of the lower portion of the n-semiconductor layers 150, and the rest of the lower portion may be formed such that they are integrated with the other portions of the n-semiconductor layers 150.

In addition, although the nanorods have been described as being formed by etching in this embodiment, this is not intended to be limiting. Rather, the nanorods may be formed through a selective regrowth process.

Afterwards, as illustrated in FIG. 3C, the reflective electrode layer 120 and the metal backing layer 110 are sequentially disposed on the p-semiconductor layer 130. Ni and/or Au may be deposited to a thickness ranging from tens to hundreds of nanometers using an E-beam evaporator. However, in the case of a vertical light emitting device, some materials such as, but not limited to, Ni/Ag, Pt/Ag, Ru/Ag, and Ir/Ag may be used, since reflectivity is important. Subsequently, heat treatment is performed at a temperature ranging from 300° C. to 600° C., thereby forming the reflective electrode layer 120.

Afterwards, the metal backing layer 110 is formed to a certain thickness, particularly by vapor deposition, such as electroplating of metals, sputtering, E-beam evaporation, or thermal evaporation, or by wafer diffusion bonding, in which a reflective metal substrate is bonded to the reflective electrode layer 120 by placing the reflective metal substrate on the reflective electrode layer 120 and pressing them at a temperature of about 300° C. such that they are brought into tight contact with each other.

Afterwards, the substrate 200 is removed by radiating a laser beam through the substrate 200. Then, the n-semiconductor layer 150 made of GaN absorbs the laser beam, and GaN is decomposed into Ga metal and $N_2$ gas, so that the substrate 200 is removed from the remainder of the structure.

Subsequently, as illustrated in FIG. 3D, quantum dots 180 may be disposed in the space 102 between the nanorods 100. In this step, the quantum dots 180 are first dispersed in a solvent 182, such as acetone or alcohol, and are then disposed in the space 102 between the nanorods 100. Here, the quantum dots 180 may have a capping ligand or surfactant adhered to the surface thereof, such that they have adhering force to the surface of the nanorods 100, which are made of, for example, GaN/InGaN, on the basis of the polarity and bonding characteristics of the capping ligand or surfactant. The adhering force may be increased through the conversion of the ligand. In an example, the ligand on the surface of the quantum dots 180 is converted by dispersing the quantum dots 180 in a mixture solution of chloroform and Tetramethyl Ammonium Hydroxide (TMAH), and then adding oleic acid and Mercaptopropionic Acid (MPA) to the solution. Through this conversion of the ligand, the quantum dots 180 are attached is to the surface of the active layer 140 between the nanorods 100. After the quantum dots 180 are distributed in the space 102 between the nanorods 100, the solvent 182 is evaporated by heat treatment, for example, heat treatment at a temperature of 100° C. or less.

Afterwards, as illustrated in FIG. 3E, the anti-reflection electrode layer 160 is formed on the nanorods 100. The anti-reflection electrode layer 160 is made of a material such as ITO, ZnO, $SiO_2$, $Si_3N_4$, and IZO, and is deposited by Plasma-Enhanced Chemical Vapor Deposition (PECVD). If it is not easy to form the anti-reflection electrode layer 160, a filler 190 is disposed in the space 102 between the nanorods 100. The filler 190 is made of a material such as, but not limited to, SOG, PI, PS, and PC. In this embodiment, the anti-reflection electrode layer 160 can be formed, for example, by E-beam processing or sputtering without using the filler, since the intervals between the nanorods 100 are narrow and the nanorods 100 are large enough.

Afterwards, in the following processing, an n-electrode pad 170 including an electrode extension 172 is disposed on the anti-reflection electrode layer 160, thereby completing the vertical light emitting device 10. Here, the n-electrode pad 170 is a negative electrode, which is formed by depositing a Ti/Al or Cr/Au layer, selectively together with a Cr/Au or Ni/Au layer that overlies the Ti/Al or Cr/Au layer, using a deposition apparatus.

In the light emitting device 10 fabricated by the method described above, it is possible to increase light emission efficiency by increasing the density of quantum dots participating in FRET, generate visible light, including white light, due to the ease with which the light emission wavelengths are adjusted, and decrease the amount of heat that is generated as a result of the direct emission of light from the MQW.

Figure 4:
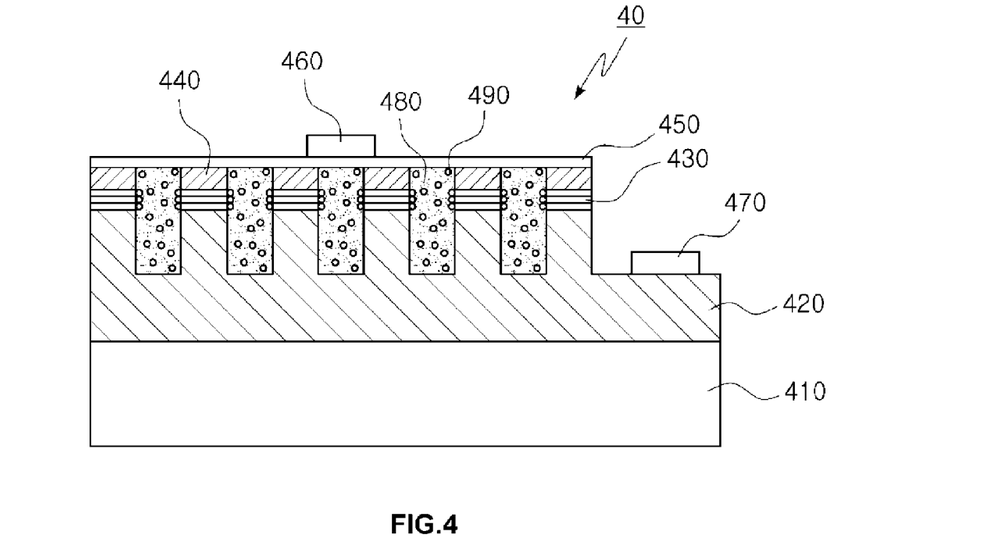
FIG. 4 is a cross-sectional view that illustrates a light emitting device according to another exemplary embodiment of the invention.
Figure 5:
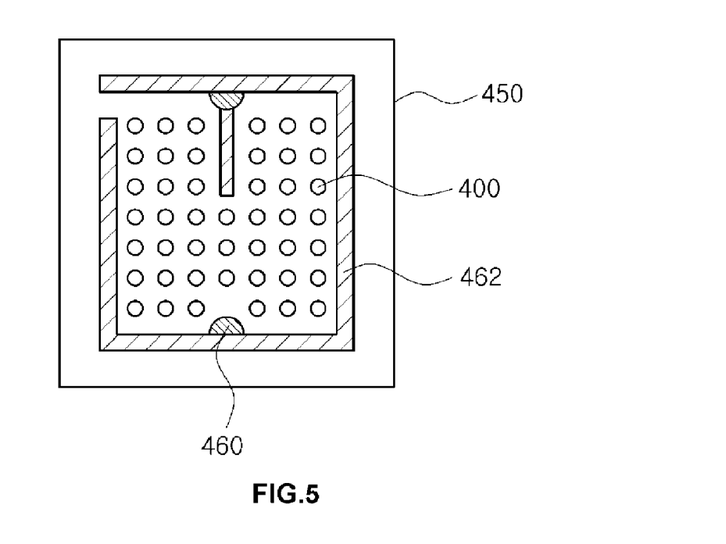
FIG. 5 is a top plan view of the light emitting device illustrated in FIG. 4.

FIG. 4 is a cross-sectional view that illustrates a light emitting device 40 is according to another exemplary embodiment of the invention, and FIG. 5 is a top plan view of the light emitting device 40 illustrated in FIG. 4.

The light emitting device 40 is a lateral light emitting device, and may include a substrate 410, an n-semiconductor layer 420 disposed on the substrate 410, with rods disposed on a portion thereof, and nanorods 400. Each of the nanorods 400 may include an active layer 430 and a p-semiconductor layer 440, which are sequentially stacked on the corresponding rod of the n-semiconductor layer 420. The light emitting device 40 also includes a transparent electrode layer 450 disposed on the nanorods 400, a p-electrode pad 460 disposed on the transparent electrode layer 450, an n-electrode pad 470 disposed on the other portion of the n-semiconductor layer 420, and quantum dots 480 and a filler 490 filling the space between the nanorods 400.

The substrate 410 may be a sapphire substrate selected in consideration of lattice matching with a nitride semiconductor material, which is grown thereon. The sapphire substrate is generally used, since it is stable at high temperatures and the nitride semiconductor material can be grown thereon relatively easily. However, in this embodiment, the substrate 410 is not limited to the sapphire substrate, but can be made of a material such as, but not limited to, SiC, Si, GaN, and AlN.

The n-semiconductor layer 420 may be made of n-type $Al_xIn_yGa_{1-x-y}N$, where 0≤x, y, and x+y=1, in which a semiconductor material is doped with an n-dopant. Examples of the semiconductor material may include, but not limited to, GaN, AlGaN, and InGaN, and examples of the n-dopant may include, but not limited to, Si, Ge, Se, Te, and C. The n-semiconductor layer 420 has rods on a portion thereof, the rods being spaced apart from one another in a matrix configuration. The rods form the respective lower portions of the nanorods 400.

The nanorods 400 may be disposed on the respective rods of the n-semiconductor layer 420, such that they are spaced apart from one another in a matrix configuration. In each of the nanorods 400, the active layer 430 and the p-semiconductor layer 440 are sequentially stacked on the rod of the n-semiconductor layer 420, and the active layer 430 is exposed. The diameter of the nanorods 100 may be 1 μm or less, and the interval between the nanorods 100 may be 1 μm or less.

Although each rod of the n-semiconductor layer 420, which forms part of the individual nanorod 400, has been described as being longer than the p-semiconductor layer 440 of the nanorod 400 in this embodiment, this is not intended to be limiting. Rather, various shapes may be made as long as the active layer 430 is exposed. In an example, each rod of the n-semiconductor layer 420 may be formed such that it is short, so that only the portion of the n-semiconductor layer 420 that adjoins the underside of the active layer 430 can form part of the nanorod 400.

The active layer 430 may have a Multiple Quantum Well (MQW) structure, or a single quantum well structure. The barrier and well layers are semiconductor layers made of a material such as binary to quaternary compounds denoted by the general formula: $Al_xIn_yGa_{1-x-y}N$, where 0≤x, y, and x+y=1. In an example, the MQW structure can be used by growing the InGaN layer as a well layer and the GaN layer as a barrier layer.

The p-semiconductor layer 440 may be made of p-type $Al_xIn_yGa_{1-x-y}N$, where 0≤x, y, and x+y=1. For example, a nitride semiconductor material, such as GaN, AlGaN, or InGaN, can be doped with a dopant, such as Mg, Zn, or Be.

The transparent electrode layer 450 serves to emit light that is radiated to the outside. Thus, the transparent electrode layer 450 has excellent electrical characteristics and is is less likely to obstruct light emission, and can be, for example, a Ni/Au, ZnO, or ITO layer.

The p-electrode pad 460 is a positive electrode, and may be disposed on the transparent electrode layer 450, which is disposed on the p-semiconductor layer 440. The n-electrode pad 470 is a negative electrode, and may be disposed on the other portion of the n-semiconductor layer 420, which is mesa-etched. Here, as illustrated in FIG. 5, the p-electrode pad 460 has a rectangular electrode extension 462 in order to prevent or reduce current crowding, which occurs under the p-electrode pad 460, and to induce a uniform current to the multiple nanorods 400.

Although the electrode extension 462 has been described as being rectangular in this embodiment, this is not intended to be limiting. Rather, various other structures can be used as long as they can alleviate current crowding.

The quantum dots 480 may be formed between the nanorods 400, and emit light by absorbing the energy excited from the MQW. The quantum dots may emit strong light due to FRET if they are sufficiently close to the MQW, for example, a distance of 10 nm or less.

The filler 490 may be formed between the nanorods 400 for the purpose of filling the space not occupied by the quantum dots 480, which is formed between the nanorods 400, and the purpose of supporting the transparent electrode layer 450 in the case it is not easy to form the transparent electrode layer 450.

The quantum dots 480 and the filler 490 of this embodiment are not described in detail, since they are configured in a similar manner to those of the foregoing embodiment.

Since the light emitting device 40 has the above-described structure, it is possible to increase light emission efficiency by increasing the density of the quantum dots that participate in FRET, generate visible light, including white light, due to the ease with which the is light emission wavelengths are adjusted, and decrease the amount of heat that is generated as a result of the direct emission of light from the MQW.

Hereinafter, with reference to FIGS. 6A to 6D, a method of fabricating a light emitting device according to another exemplary embodiment of the invention will be described.

FIGS. 6A to 6D are cross-sectional views that illustrate a process of fabricating the light emitting device according to another exemplary embodiment of the invention.

The method of fabricating the light emitting device 40 may include the steps of: sequentially growing an n-semiconductor layer 420, an active layer 430, and a p-semiconductor layer 440 on a substrate 410; forming a plurality of nanorods 400 by etching the p-semiconductor layer 440 using a mask pattern such that the active layer 430 is exposed, the mask pattern having pattern elements spaced apart from one another in a matrix configuration; disposing quantum dots 480 between the nanorods 400; and forming a transparent electrode layer 450 on the nanorods 400.

Figure 6:
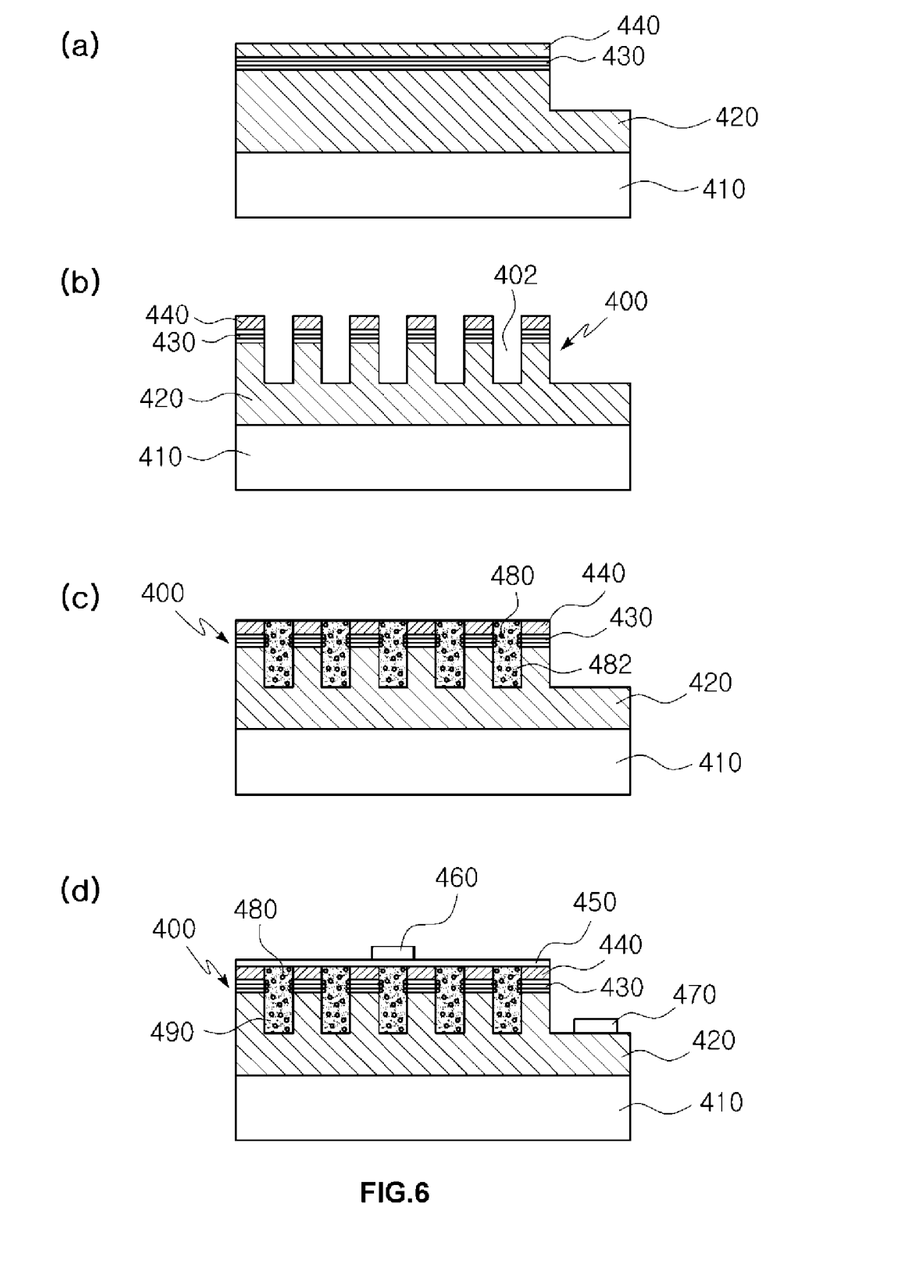
FIGS. 6A to 6D are cross-sectional views that illustrate a process of fabricating the light emitting device according to another exemplary embodiment of the invention.

Describing in greater detail, as illustrated in FIG. 6A, in this embodiment, the n-semiconductor layer 420, the active layer 430, and the p-semiconductor layer 440 are sequentially grown on the substrate 410. In an example, they are sequentially epitaxially grown on the substrate 410 by MOCVD. Afterwards, the other portion of the n-semiconductor layer 420, on which the nanorods 400 of the n-semiconductor layer 150 are not to be formed, is mesa-etched so that the n-electrode pad 470 can be formed thereon.

As illustrated in FIG. 6B, the p-semiconductor layer 440 may be etched using a mask pattern that has pattern elements spaced apart from one another in a matrix configuration. The mask pattern may be made of a material such as, but not limited to, $SiO_2$, Anodic Aluminum Oxide (AAO), and metal. This etching may be conducted to the depth at which the MQW of the is active layer 430 is completely exposed, as described later. As a result of the etching, the multiple nanorods 400, which are spaced apart from one another in a matrix configuration, are formed. Each of the nanorods 400 includes the n-semiconductor layer 420, the active layer 430, and the p-semiconductor layer 440. Here, the diameter of each nanorod 400 may be 1 μm or less and the width of individual space 402 defined between the nanorods 100 may be 1 μm or less.

Although the rod of the n-semiconductor layer 420, which forms part of the individual nanorod 400, has been described as being longer than the p-semiconductor layer 440 of the nanorod 400 in this embodiment, this is not intended to be limiting. Rather, various shapes can be made as long as the active layer 430 is exposed. In an example, each rod of the n-semiconductor layer 420 can be formed such that it is short, so that only the portion of the n-semiconductor layer 420 that adjoins the active layer 430 can form part of the nanorod 400.

In addition, although the nanorods 400 have been described as being formed by etching in this embodiment, this is not intended to be limiting. Rather, the nanorods can be formed through a selective regrowth process.

Subsequently, as illustrated in FIG. 6C, the quantum dots 480 are disposed in the space 402 between the nanorods 400. Specifically, the quantum dots 480 are first dispersed in a solvent 482, such as acetone or alcohol, and are then disposed in the space 402 between the nanorods 400. Here, the quantum dots 480 have a capping ligand or surfactant adhered to the surface thereof, such that they have adhering force to the surface of the nanorods 400, which are made of, for example, GaN/InGaN, on the basis of the polarity and bonding characteristics of the capping ligand or surfactant. The adhering force may be increased through the conversion of the ligand. In an example, the ligand on the surface of the quantum dots 480 is converted by dispersing the quantum dots 480 in a mixture solution of chloroform and Tetramethyl Ammonium Hydroxide (TMAH), and then adding oleic acid and Mercaptopropionic Acid (MPA) to the solution. Through this conversion of the ligand, the quantum dots 480 are attached to the surface of the active layer 430 between the nanorods 400. After the quantum dots 480 are distributed in the space 402 between the nanorods 400, the solvent 482 is evaporated by heat treatment, for example, heat treatment at a temperature of 100° C. or less.

Subsequently, as illustrated in FIG. 6D, the transparent electrode layer 450 is disposed on the nanorods 400. If it is not easy to form the transparent electrode layer 450, a filler 490, which is made of a material such as, but not limited to, SOG, PI, PS, and PC, is disposed in the space 102 between the nanorods 400. In addition, the transparent electrode layer 450 can be formed, for example, by E-beam processing or sputtering without using the filler, when the intervals between the nanorods 400 are narrow and the nanorods 400 are large enough.

Afterwards, in the following processing, a p-electrode pad 460 including an electrode extension 462 may be disposed on the transparent electrode layer 450, and an n-electrode pad 470 may be disposed on the other portion of the n-semiconductor layer 420 that is mesa-etched, thereby completing the horizontal light emitting device 40.

In the light emitting device 40 fabricated by the method described above, it is possible to increase light emission efficiency by increasing the density of quantum dots participating in FRET, generate visible light, including white light, due to the ease with which the light emission wavelengths are adjusted, and decrease the amount of heat that is generated as a result of the direct emission of light from the MQW.

The above descriptions of specific exemplary embodiments of the present invention have been presented for the purposes of illustration and description. They are not intended to be exhaustive or to limit the invention to the precise forms disclosed, and obviously is many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A light emitting device, comprising:
    a metal layer;
    a reflective layer disposed on the metal layer;
    a plurality of nanorods disposed on the reflective layer in a matrix configuration such that the nanorods are spaced apart from one another, wherein each of the nanorods comprises a p-semiconductor layer, an active layer, and an n-semiconductor layer, which are sequentially stacked on the reflective layer;
    an anti-reflection layer disposed on the nanorods;
    quantum dots disposed between the nanorods; and
    at least one electrode extension disposed on the anti-reflection layer, the at least one electrode extension bounding the plurality of nanorods in an interior region thereof,
    wherein the quantum dots have a capping ligand provided on respective surfaces thereof,
    wherein the capping ligand is converted, and
    wherein at least some of the quantum dots are attached to respective portions of corresponding exposed surfaces of the respective active layers by the converted capping ligand.

2. The light emitting device of claim 1, wherein the quantum dots comprise a direct band gap material having a band gap of 1.0 eV or more.

3. The light emitting device of claim 2, wherein the quantum dots comprise a material selected from the group consisting of ZnSe, ZnS, CdSe, CdS, and InP.

4. The light emitting device of claim 1, further comprising a filler disposed between the nanorods, wherein the filler comprises a material selected from the group consisting of spin-on glass, polyimide, polystyrene, and polycarbonate.

5. The light emitting device of claim 1, wherein the nanorods are spaced apart from one another at an interval of 1 μm or less.

6. The light emitting device of claim 1, wherein the nanorods have a diameter of 1 μm or less.

7. The light emitting device of claim 1, wherein the nanorods have lengths ranging from 500 nm to 4 μm.

8. A light emitting device comprising:
    a substrate;
    an n-semiconductor layer disposed on the substrate, wherein the n-semiconductor layer has rods on a portion thereof, the rods being spaced apart from one another in a matrix configuration;
    a plurality of nanorods, wherein each of the nanorods comprises an active layer and a p-semiconductor layer, which are sequentially stacked on a corresponding rod of the n-semiconductor;
    a transparent electrode layer disposed on the nanorods; and
    quantum dots disposed between the nanorods.

9. The light emitting device of claim 8, wherein the quantum dots comprise a direct band gap material having a band gap of 1.0 eV or more.

10. The light emitting device of claim 9, wherein the quantum dots comprise a material selected from the group consisting of ZnSe, ZnS, CdSe, CdS, and InP.

11. The light emitting device of claim 8, further comprising a filler disposed between the nanorods, wherein the filler comprises a material selected from the group consisting of spin-on glass, polyimide, polystyrene, and polycarbonate.

12. The light emitting device of claim 8, wherein some quantum dots are attached to a surface of the active layer of the nanorod.

13. The light emitting device of claim 8, wherein the quantum dots have capping ligand or surfactant provided on surfaces thereof.

14. The light emitting device of claim 8, wherein the nanorods are spaced apart from one another at an interval of 1 μm or less.

15. The light emitting device of claim 8, wherein the nanorods have a diameter of 1 μm or less.

16. The light emitting device of claim 8, wherein the nanorods have lengths ranging from 500 nm to 4 μm.

17. A method of fabricating a light emitting device, comprising:
    sequentially growing an n-semiconductor layer, an active layer, and a p-semiconductor layer on a substrate;
    forming a plurality of nanorods by etching the p-semiconductor layer, such that a part of the substrate is exposed, using a mask pattern, the mask pattern having pattern elements spaced apart from one another in a matrix configuration;

sequentially forming a reflective layer and a metal layer on the p-semiconductor layer and then removing the substrate;

disposing quantum dots between the nanorods; and forming an anti-reflection layer on the nanorods.

18. The method of claim 17, wherein etching the p-semiconductor layer is conducted using the mask pattern comprising a material selected from the group consisting of $SiO_2$, anodic aluminum oxide, and metal.

19. The method of claim 17, wherein disposing quantum dots between the nanorods comprises dispersing the quantum dots in a solvent and disposing the quantum dots between the nanorods.

20. The method of claim 19, wherein the solvent is acetone or alcohol.

21. The method of claim 17, wherein disposing quantum dots between the nanorods comprises converting ligand on surfaces of the quantum dots by dispersing the quantum dots in a mixture solution of chloroform and tetramethyl ammonium hydroxide and adding oleic acid and mercaptopropionic acid to the solution in which the quantum dots are dispersed.

22. The method of claim 19, further comprising, after disposing quantum dots between the nanorods:

evaporating the solvent through heat treatment; and filling space between the nanorods with a material selected from the group consisting of spin-on glass, polyimide, polystyrene, and polycarbonate.

23. The method of claim 17, wherein disposing quantum dots between the nanorods comprises attaching the quantum dots to a surface of the active layer.

24. A method of fabricating a light emitting device, comprising:

sequentially growing an n-semiconductor layer, an active layer, and a p-semiconductor layer on a substrate;

forming a plurality of nanorods by etching the p-semiconductor layer using a mask pattern such that the active layer is exposed, the mask pattern having pattern elements spaced apart from one another in a matrix configuration;

disposing quantum dots between the nanorods; and forming a transparent electrode layer on the nanorods.

25. The method of claim 24, wherein etching the p-semiconductor layer is conducted using the mask pattern comprising a material selected from the group consisting of $SiO_2$, anodic aluminum oxide, and metal.

26. The method of claim 24, wherein disposing quantum dots between the nanorods comprises dispersing the quantum dots in a solvent and disposing the quantum dots between the nanorods.

27. The method of claim 26, wherein the solvent is acetone or alcohol.

28. The method of claim 24, wherein disposing quantum dots between the nanorods comprises converting ligand on surfaces of the quantum dots by dispersing the quantum dots in a mixture solution of chloroform and tetramethyl ammonium hydroxide and adding oleic acid and mercaptopropionic acid to the solution in which the quantum dots are dispersed.

29. The method of claim 26, further comprising, after disposing quantum dots between the nanorods:

evaporating the solvent through heat treatment; and filling space between the nanorods with a material selected from the group consisting of spin-on glass, polyimide, polystyrene, and polycarbonate.

30. The method of claim 24, wherein disposing quantum dots between the nanorods comprises attaching the quantum dots to a surface of the active layer.

* * * * *